(12) United States Patent
Aleksov et al.

(10) Patent No.: US 10,103,037 B2
(45) Date of Patent: Oct. 16, 2018

(54) FLEXIBLE MICROELECTRONIC SYSTEMS AND METHODS OF FABRICATING THE SAME

(71) Applicant: Intel Corporation, Santa Clara, CA (US)

(72) Inventors: Aleksandar Aleksov, Chandler, AZ (US); Dilan Seneviratne, Chandler, AZ (US); Charavana K. Gurumurthy, Gilbert, AZ (US); Ching-Ping J. Shen, Gilbert, AZ (US); Daniel N. Sobieski, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 195 days.

(21) Appl. No.: 14/273,754

(22) Filed: May 9, 2014

(65) Prior Publication Data

US 2015/0325491 A1 Nov. 12, 2015

(51) Int. Cl.
*H01L 23/053* (2006.01)
*H01L 21/56* (2006.01)
(Continued)

(52) U.S. Cl.
CPC ............ *H01L 21/561* (2013.01); *H01L 21/78* (2013.01); *H01L 23/293* (2013.01);
(Continued)

(58) Field of Classification Search
CPC ...................................................... H01L 21/561
(Continued)

(56) References Cited

U.S. PATENT DOCUMENTS 5,165,956 A * 11/1992 Wong .................... H01L 23/296
257/E23.12
5,893,724 A * 4/1999 Chakravorty ........... H01L 21/56
257/E21.502
(Continued)

FOREIGN PATENT DOCUMENTS

JP 09-92759 A 4/1994
JP 06-125103 A 5/1994
(Continued)

OTHER PUBLICATIONS

Office Action received for Taiwan Patent Application No. 104110468, dated Nov. 12, 2015, 1 page of English search report and 8 pages of Taiwan Office Action.
(Continued)

*Primary Examiner* — Ajay K Arora
(74) *Attorney, Agent, or Firm* — Green, Howard & Mughal, LLP

(57) ABSTRACT

Microelectronic systems encapsulated in a stretchable/flexible material, which is skin/bio-compatible and able to withstand environmental conditions. In one embodiment of the present description, the microelectronic system includes a microelectronic device that is substantially encapsulated in a non-permeable encapsulant, such as, butyl rubbers, ethylene propylene rubbers, fluoropolymer elastomers, or combinations thereof. In another embodiment, the microelectronic system includes a microelectronic device that is substantially encapsulated in a permeable encapsulant, such as polydimethylsiloxane, wherein a non-permeable encapsulant substantially encapsulates the permeable encapsulant.

16 Claims, 7 Drawing Sheets

(51) Int. Cl.
 H01L 23/29 (2006.01)
 H01L 23/31 (2006.01)
 H01L 23/00 (2006.01)
 H01L 21/78 (2006.01)
(52) U.S. Cl.
 CPC ........ *H01L 23/3135* (2013.01); *H01L 23/564* (2013.01); *H01L 24/48* (2013.01); *H01L 24/85* (2013.01); *H01L 24/96* (2013.01); *H01L 21/568* (2013.01); *H01L 23/3107* (2013.01); *H01L 24/45* (2013.01); *H01L 2224/16245* (2013.01); *H01L 2224/45124* (2013.01); *H01L 2224/45139* (2013.01); *H01L 2224/45144* (2013.01); *H01L 2224/45147* (2013.01); *H01L 2224/45155* (2013.01); *H01L 2224/48091* (2013.01); *H01L 2224/48106* (2013.01); *H01L 2224/48227* (2013.01); *H01L 2224/73265* (2013.01); *H01L 2924/06* (2013.01); *H01L 2924/062* (2013.01); *H01L 2924/0715* (2013.01); *H01L 2924/181* (2013.01); *H01L 2924/186* (2013.01); *H01L 2924/1811* (2013.01)
(58) Field of Classification Search
 USPC ....................................................... 257/701
 See application file for complete search history.

(56) References Cited

U.S. PATENT DOCUMENTS

| | | | |
|---|---|---|---|
| 7,187,072 B2 | 3/2007 | Fukutomi et al. | |
| 2001/0008305 A1* | 7/2001 | McLellan | H01L 21/4832 257/692 |
| 2003/0027899 A1* | 2/2003 | Takasaki | C08G 59/18 523/400 |
| 2006/0231288 A1 | 10/2006 | Vanfleteren et al. | |
| 2008/0046080 A1* | 2/2008 | Vanden Bulcke | A61N 1/0541 623/10 |
| 2008/0275327 A1* | 11/2008 | Faarbaek | A61B 5/0002 600/382 |
| 2010/0052131 A1* | 3/2010 | Tay | H01L 25/03 257/686 |
| 2010/0132765 A1* | 6/2010 | Cumpston | H01L 31/035281 136/249 |
| 2012/0018858 A1* | 1/2012 | Chen | H01L 21/565 257/659 |

FOREIGN PATENT DOCUMENTS

| | | |
|---|---|---|
| JP | 2006-176791 A | 7/2006 |
| JP | 2007-128946 A | 5/2007 |
| JP | 8-153832 | 7/2008 |
| JP | 2009-051876 A | 3/2009 |
| JP | 2010-074165 A | 4/2010 |
| JP | 2011-124381 A | 6/2011 |
| JP | 2016-504765 A | 2/2016 |
| TW | 200720358 A | 6/2007 |
| TW | 201217161 A | 5/2012 |
| TW | 201416057 A | 5/2014 |
| WO | 9526047 | 9/1995 |
| WO | 2010086416 | 8/2010 |

OTHER PUBLICATIONS

Notice of Allowance received for Taiwanese Patent Application No. 104110468, dated Aug. 3, 2016, 3 pages of Notice of Allowance and 1 page of English Translation.
Office Action received for Japanese Patent Application No. 2015-075557, dated Jun. 7, 2016, 4 pages of Office Action including 2 pages of English Translation.
Decision of Refusal for Japanese Patent Applicatopm No. 2015-075557, dated Feb. 7, 2017. Translation provided.
Notice of Allowance for Japanese Patent Application No. 2015-075557, dated Jun. 23, 2017. Translation provided.

* cited by examiner

FLEXIBLE MICROELECTRONIC SYSTEMS AND METHODS OF FABRICATING THE SAME

TECHNICAL FIELD

Embodiments of the present description generally relate to the field of microelectronic consumer devices, and, more particularly, to microelectronic systems that are encapsulated in a stretchable/flexible material that is skin/bio-compatible and able to withstand environmental conditions.

BACKGROUND

As microelectronic devices are becoming ever smaller, the goal of equipping a multitude of objects with small identification devices, which may connect with the internet to network and communicate with each other (known as Internet of Things ("IoT")), is becoming a reality. Wearable microelectronics systems are expected to be the prevalent products enabling the IoT. These wearable microelectronic systems can be divided in two categories according to how they are worn: 1) Electronic Accessories, which are systems that have a rigid casing with a form factor defined by a wearable conventional fashion accessory, such as wristbands, bracelets, watches, and the like, and 2) "Intimately" wearable systems, which are not encased in a rigid casings, rather they are sewn/glued into clothes or worn directly attached to the user's skin. These "intimately" wearable systems must be unobtrusive to the everyday experience (i.e., they cannot scratch, standout, be rigid, etc.), must be skin/bio-compatible as the materials may be in contact with the human skin, must be able to withstand environmental conditions, such as ultraviolet radiation, salt/chlorinated water, washing, must be inert to skin products/cosmetics, and must be, of course, inert to the skin chemistry itself. Furthermore, from a mechanical standpoint, they need to substantially mimic the properties of skin and clothing and provide for a cyclical stretching/flexing ability in the 10-30% range (requiring a significantly higher stretching/flexing ability to failure or ultimate stretching ability). With respect to existing solutions, the most widely used packaging material is PDMS (polydimethylsiloxane). However, PDMS is permeable, i.e. does not provide a barrier for moisture and many other chemicals, which may result in damage to the electronic system from the environment over time. While this may not be a problem for short or single-use systems (product lifetime of several days), this will be a limitation for the reliability of systems having a longer product life-time. Therefore, there is a need for stretchable packaging materials, which are non-permeable, for the fabrication of stretchable, intimately wearable microelectronic systems.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
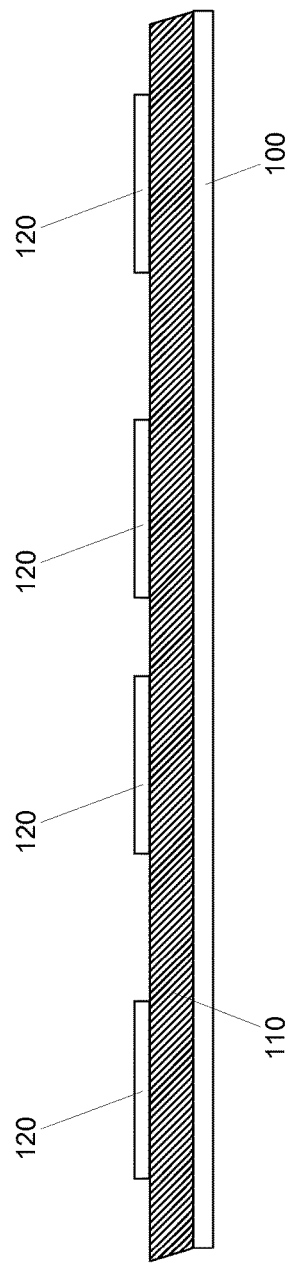
FIGS. 1-5 illustrates cross-sectional views of a method of fabricating a microelectronic system, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

For the purpose of the present description, the term "flexible material" may be defined to mean a material or structure that is resilient, wherein the material may be subjected to a stretching (elongation) force and/or a twisting (rotational torsion) force, and return to its original shape when the force(s) are released. Furthermore, for the purpose of the present description, the term "permeable material" may be defined to mean a material or structure that does not act as a significant barrier to air and water permeating therethrough. Moreover, for the purpose of the present description, the term "non-permeable material" may be defined to mean a material or structure that acts as a barrier that does not allow air and water to permeate therethrough.

Embodiments of the present description include microelectronic systems that are encapsulated in a stretchable/flexible material, which is skin/bio-compatible and able to withstand environmental conditions. In one embodiment of the present description, the microelectronic system includes a microelectronic device that is substantially encapsulated in a non-permeable encapsulant, such as, butyl rubbers, ethylene propylene rubbers, fluoropolymer elastomers, or combinations thereof. In another embodiment, the microelectronic system includes a microelectronic device that is substantially encapsulated in a permeable encapsulant, such as polydimethylsiloxane, wherein a non-permeable encapsulant substantially encapsulates the permeable encapsulant.

FIGS. 1-5 illustrate a process of fabricating a microelectronic system, according to one embodiment of the present invention. As shown in FIG. 1, a carrier 100 may be provided and a flexible first encapsulation material may be formed as a layer 110 on the carrier 100. The carrier 100 may be any appropriate, substantially rigid structure capable of supporting material during subsequent fabrication processes. The flexible first encapsulation material layer 110 may be formed by any appropriate process known in the art, including, but not limited to, deposition, lamination, and the like.

As further shown in FIG. 1, a trace network 120 may be formed on the flexible first encapsulation material layer 110. The trace network 120 may be a plural of conductive traces (not specifically illustrated) which used for electronic communication between microelectronic components, as will be discussed, and, as trace networks 120 are known in the art, for the sake of brevity and conciseness, is illustrated as a generic layer. The conductive traces (not shown) of the trace network 120 may be composed of any conductive material, including but not limited to metals, such as copper, aluminum, gold, titanium, nickel, tungsten, silver, zirconium, cobalt, and alloys thereof. As will be understood, the trace network 120 may be formed by any technique known in the art. In one embodiment, the trace network 120 may be formed form by a subtractive process comprising the deposition of a metal layer followed by lithography and metal etch/patterning, as know in the art. In another embodiment, the trace network 120 may be formed form by a semi-additive process comprising the deposition of a metal seed layer followed by lithography, plating, photoresist removal, and seed layer etch, as know in the art.

Figure 2:
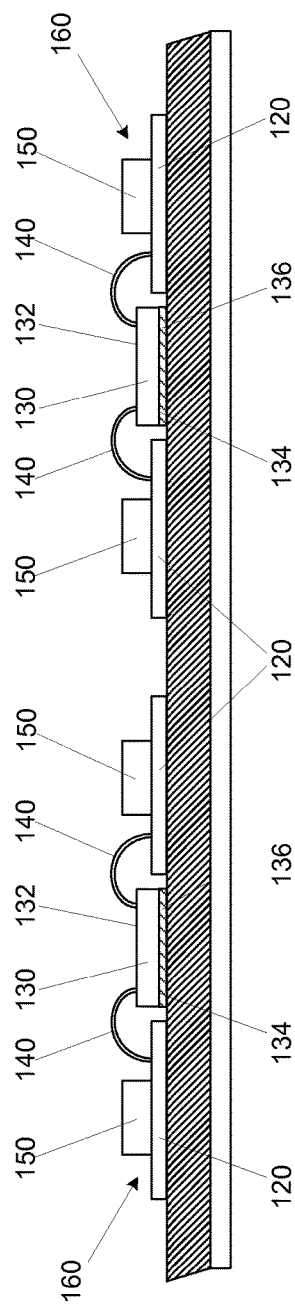

As shown in FIG. 2, a primary microelectronic device 130 may be attached by a back surface 134 thereof to the flexible first encapsulation material layer 110 with an adhesive material 136. The primary microelectronic device 130 may be electrically connected with the trace network 120 by at least one bond wire 140 extending from an active surface 132 of the primary microelectronic device 130 to the trace network 120 to form at least one microelectronic component structure 160. At least one secondary microelectronic device 150, either an active and/or a passive device, may be attached to and in electrical communication with the trace network 120 and may be included in the microelectronic component structure(s) 160.

The primary microelectronic device 130 may be any appropriate active device including, but is not limited to, a microprocessor, a chipset, an application specific integrated circuit, or the like. The secondary microelectronic device(s) 150 may be any appropriate device including, but is not limited to, a wireless device, a memory device, or the like, which may support the operation of the primary microelectronic device 130. The bond wire(s) 140 may be composed of any conductive material, including but not limited to metals, such as copper, aluminum, nickel, silver, gold, and alloys thereof.

Figure 3:
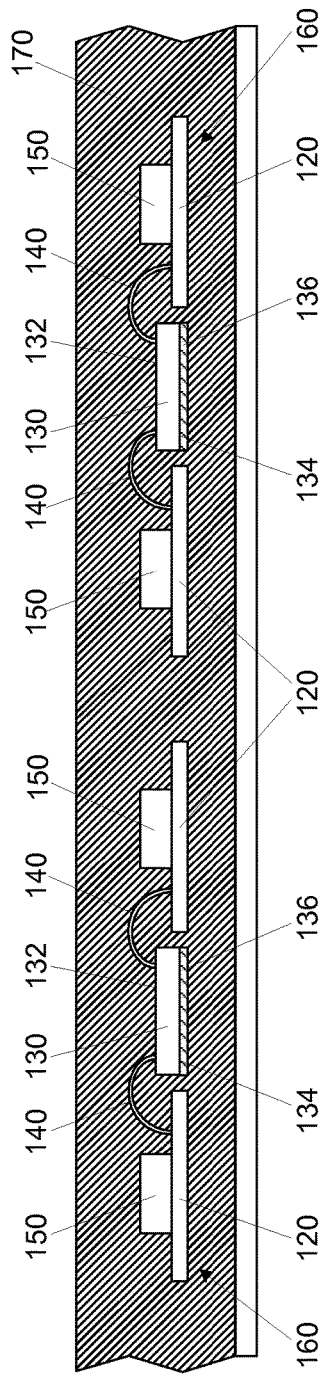

As shown in FIG. 3, additional first encapsulation material may be formed on the flexible first encapsulation material layer 110 (see FIG. 2), on the trace network 120, over the primary microelectronic device 130, over the secondary microelectronic device(s) 150, and around the bond wire(s) 140 to integrate with the flexible first encapsulation material layer 110 (see FIG. 2) to form a flexible first encapsulation structure 170. As illustrated, the flexible first encapsulation structure 170 substantially surrounds and encases the microelectronic component structure(s) 160.

Figure 4:
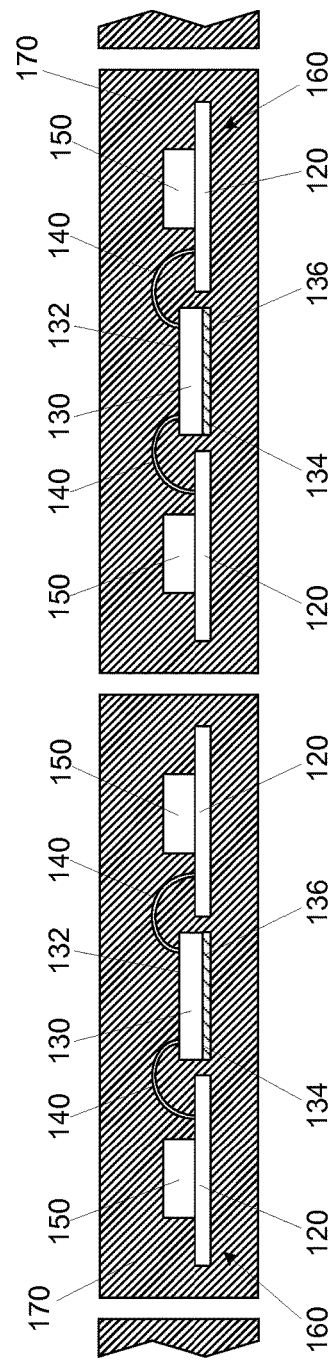
Figure 5:
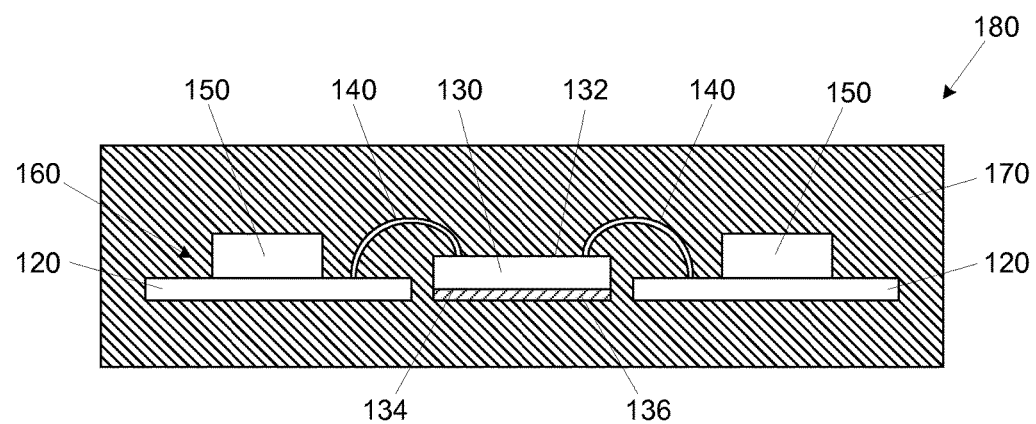

As shown in FIG. 4, the carrier 100 (see FIG. 3) may be removed and individual microelectronic component structures 160 may be singulated, such as by dicing, from one another to form individual flexible microelectronic systems 180, as shown in FIG. 5.

In one embodiment of the present invention, the flexible first encapsulation structure 170 may be a formed from a substantially non-permeable encapsulant. The non-permeable encapsulant may be selected from the group comprising of butyl rubbers, ethylene propylene rubbers (such as EPDM and EPM), fluoropolymer elastomers (such as Viton™, available from E. I. du Pont de Nemours and Company, Wilmington, Del., U.S.A.), or combinations thereof. The properties of these non-permeable encapsulants 140 compared with polydimethylsiloxane (permeable encapsulant) are set forth in Table 1 and the resistance to degradation by selected materials of these non-permeable encapsulants compared with polydimethylsiloxane (permeable encapsulant) are set forth in Table 2.

TABLE 1

| | Butyl Rubbers | Ethylene propylene rubbers | Fluoropolymer elastomers | Polydimethyl Siloxane |
|---|---|---|---|---|
| Modulus (100 MPa) | 0.5-1.0 | N/A | 0.5-7.0 | 0.7 (shore 30) to 3.3 (shore 70) |
| Biocompatible | Yes | Yes | Yes | Yes |
| Impermeable | Yes | Yes | Yes | No |

TABLE 1-continued

|  | Butyl Rubbers | Ethylene propylene rubbers | Fluoropolymer elastomers | Polydimethyl Siloxane |
| --- | --- | --- | --- | --- |
| Manufacturabilty | Solid, requires molding process | Solid, requires molding process | Solid, requires molding process | Liquid |
| Heat Resistance | −40 to 120° C. | −20 to 150° C. | −20 to >200° C. | −60 to >200° C. |

In reviewing Table 1, it may be seen why, as previously discussed, polydimethylsiloxane is used almost exclusively for flexible/stretchable electronics products. In specific, it is available as a liquid that can be easily poured and cured in a variety of ways and processes makes it very amenable product fabrication. In contrast, all other materials (non-permeable material) in their raw form are solids and require elevated temperatures and/or elevated pressures, i.e. a molding process, to form them into a desired shape. However, as it can also be seen polydimethylsiloxane is the only material here that does not provide for non-permeability, as it is fully permeable to air and water (and thus permeable to watery electrolytes that can short circuit an electronic system—such as saltwater).

TABLE 2

(Resistance: A = Excellent, B = Good, C = Fair, D = Poor/Do Not Use)

|  | Butyl Rubbers | Ethylene propylene rubbers | Fluoropolymer elastomers | Polydimethyl siloxane |
| --- | --- | --- | --- | --- |
| Animal Fats | B | B | A | A |
| Butter (Animal Fat) | B | A | A | A |
| Bleach Solution | A | A | A | B |
| Soap Solutions | A | A | A | A |
| Detergent Solutions | A | A | A | B |
| Dry Cleaning Fluids | D | D | A | D |
| Lavender Oil (lotions) | D | D | A | A |
| Coconut Oil | C | C | A | A |
| Petroleum (creams) | D | D | A | D |
| Salt Water | A | A | A | A |
| Ultraviolet radiation | A | A | A | A |
| Steam | A | C | C | B |
| Hot Water | A | A | A | A |
| Ozone | B | A | A | A |

Table 2 represents resistance to physical degradation for the selected encapsulation materials. In reviewing Table 2, animal fats and butter represent materials that may, in part, stand as a proxy for the human skin itself. Bleach solutions, soap solutions, detergent solutions, and dry cleaning fluids are indicators for how compatible the selected encapsulation materials are with washing cycles. Lavender oils, coconut oil, and petroleum are indicators for how compatible the selected encapsulation materials are with cosmetics. Salt water, ultraviolet radiation, steam, hot water, and ozone are indicators for how compatible the selected encapsulation materials are with possible environmental conditions. From table 2, it can be seen that the non-permeable encapsulation materials of butyl rubbers, ethylene propylene rubbers, and fluoropolymer elastomers perform equally well or better than permeable polydimetholsiloxane, currently used in the industry. Additionally, butyl rubber and certain types of fluoropolymer elastomers have excellent adhesion properties to various metals, which may be advantageous with regard to the durability of the microelectronic systems.

Figure 6:
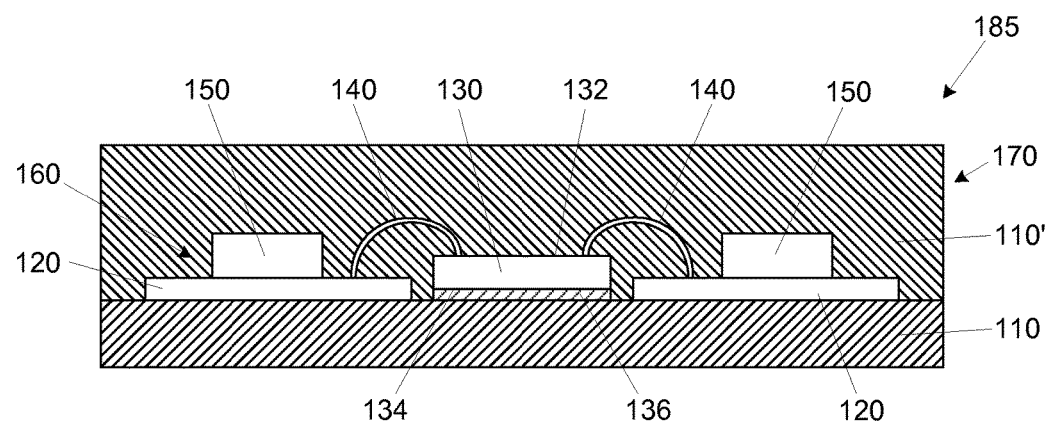
FIG. 6 illustrates a cross-sectional view of a microelectronic system, according to another embodiment of the present description.

In another embodiment of the present invention shown in FIG. 6, rather than additional first encapsulation material discussing with regard to FIG. 3, the additional material may be different from the first encapsulation material. Thus, as shown in FIG. 6, a microelectronic system 185 may comprise the flexible first encapsulation material layer 110 comprising either a permeable or a non-permeable encapsulation material, wherein a flexible second encapsulation material 110' may be formed over the at least one microelectronic component structure 160 forming a flexible permeable encapsulation structure 170' substantially encasing the at least one microelectronic component structure 160, wherein at least one of the flexible first encapsulation material 110 and the flexible second encapsulation material 110' is a non-permeable material and wherein the flexible first encapsulation material 110 is different from the flexible second encapsulation material 110'. In one embodiment, the flexible first encapsulation material 110 and the flexible second encapsulation material 110' may both be non-permeable, but different materials. In another embodiment, only one of the flexible first encapsulation material 110 and the flexible second encapsulation material 110' is a non-permeable material, and the other is a permeable material. Such a configuration could be used when potential contamination is substantially coming from one direction, wherein thus a non-permeable material between the potential contamination and the microelectronic component structure 160 is necessary.

Figure 7:
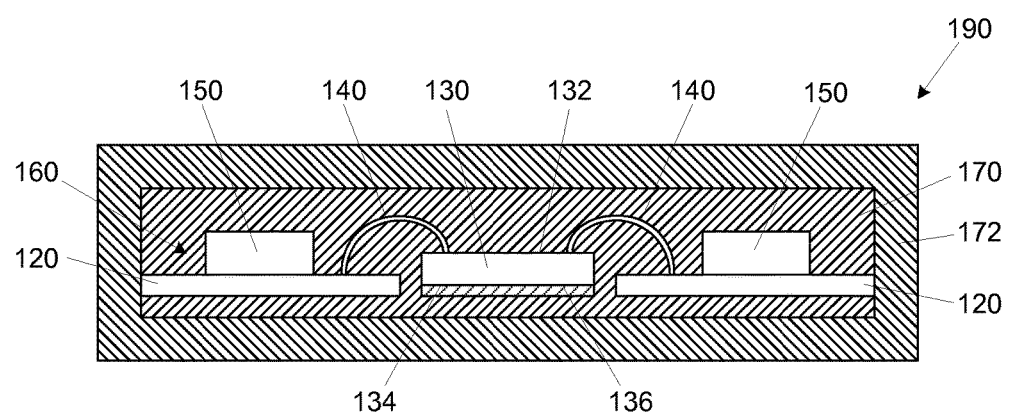
FIG. 7 illustrates a cross-sectional view of a microelectronic system, according to still another embodiment of the present description.

In further embodiment of the present invention shown in FIG. 7, the flexible first encapsulation structure 170 may be a formed from a permeable flexible encapsulant, such as polydimetholsiloxane. The flexible first encapsulation structure 170 may then be encapsulated in the non-permeable encapsulation material, as previously discussed, to form a flexible second encapsulation structure 172, thereby forming a dual-encapsulated, flexible microelectronic system 190. Such a configuration may be advantageous as the permeable encapsulant, such as polydimetholsiloxane, may be in a liquid form prior to curing. Thus, the permeable encapsulant may flow easily around the trace network 120, the primary microelectronic device 130, the secondary microelectronic device(s) 150, and the bond wire(s) 140 to form the flexible first encapsulation structure 170. The flexible first encapsulation structure 170 may be cured and then diced (as previously discussed). Thereafter, the non-permeable flexible second encapsulation structure 172 may be formed around the flexible first encapsulation structure 170. The non-permeable flexible second encapsulation structure 172 may be formed by any technique known in the art, including, but not limited to, molding processes.

Figure 8:
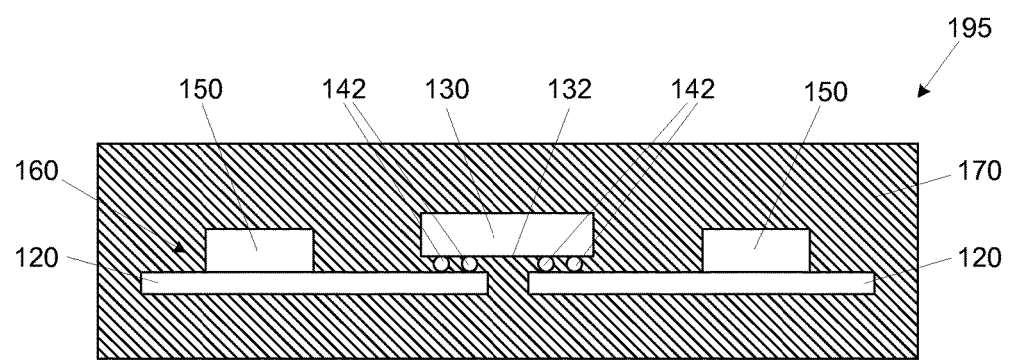
FIG. 8 illustrates a cross-sectional view of a microelectronic system, according to yet another embodiment of the present description.

The microelectronic component structure 160 illustrated in FIGS. 3-7 may be advantageous from the standpoint that by electrically connecting the microelectronic device 130 to the trace network 120 with at least one bond wire 140 may allow for some flexing without damage to the electrical connection. However, it is understood that the configuration shown in FIGS. 4-7 is not limited, as the primary microelectronic device 130 may be attached to the trace network 140 with flip-chip attachment structures 142, such as solder, conductive paste, conductive polymers, and the like to form a flip-chip, flexible microelectronic systems 195, as illustrated in FIG. 8.

Although the flexible microelectronic systems 180, 185, 190, and 195 illustrated in FIG. 5-8 are fully encased, it understood that there may be openings through the flexible first encapsulation structure 170 and the flexible second encapsulation structure 172 (if present) to allow for connectively to other electronic components and/or a power source, such as a battery.

Figure 9:
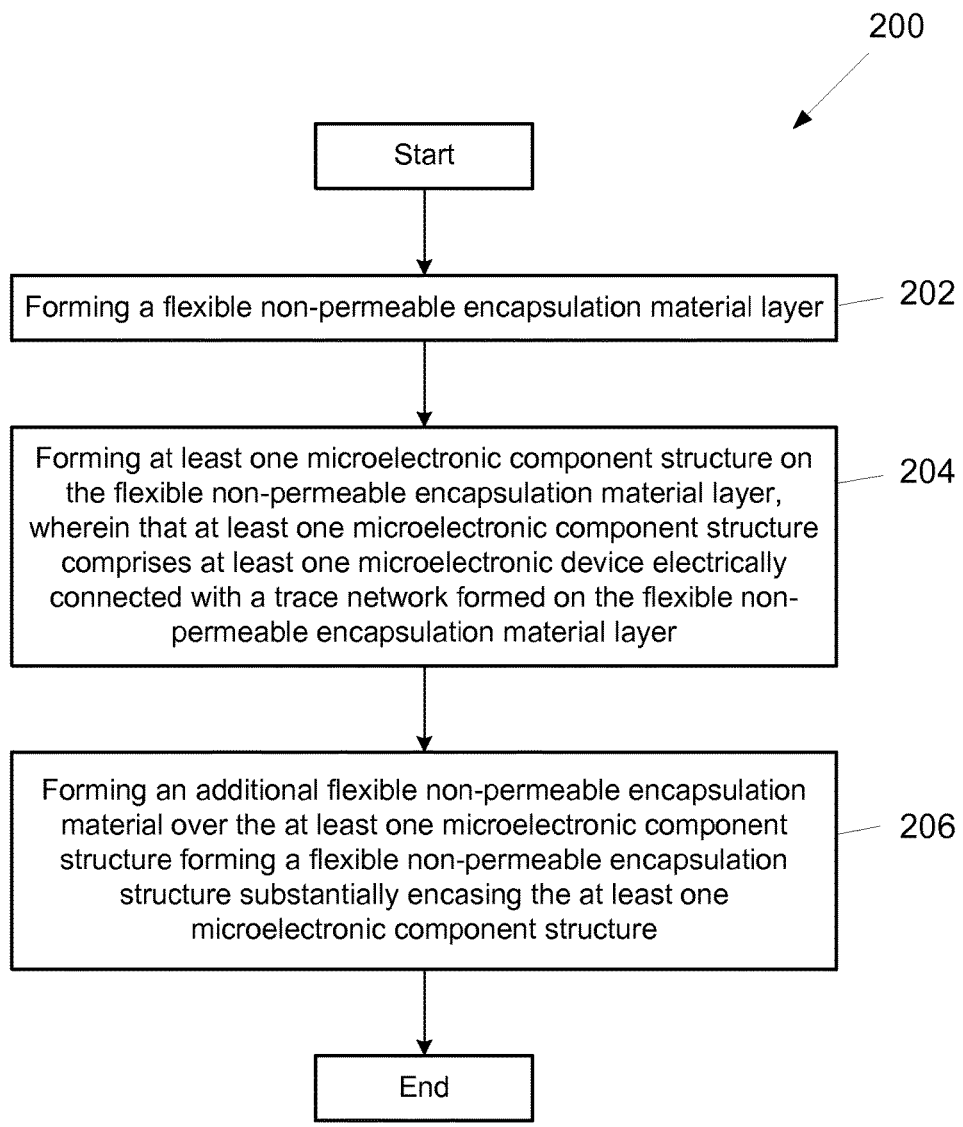
FIG. 9 is a flow diagram of a process of fabricating a microelectronic structure, according to an embodiment of the present description.

FIG. 9 is a flow chart of a process 200 of fabricating a flexible microelectronic system according to an embodiment of the present description. As set forth in block 202, a flexible non-permeable encapsulation material layer may be formed. At least one microelectronic component structure may be formed on the flexible non-permeable encapsulation material layer, wherein the at least one microelectronic component structure comprises at least one microelectronic device electrically connected with a trace network formed on the flexible non-permeable encapsulation material layer, as set forth in block 204. As set forth in block 206, additional flexible non-permeable encapsulation material may be formed over the at least one microelectronic component structure forming a flexible non-permeable encapsulation structure substantially encasing the at least one microelectronic component structure.

Figure 10:
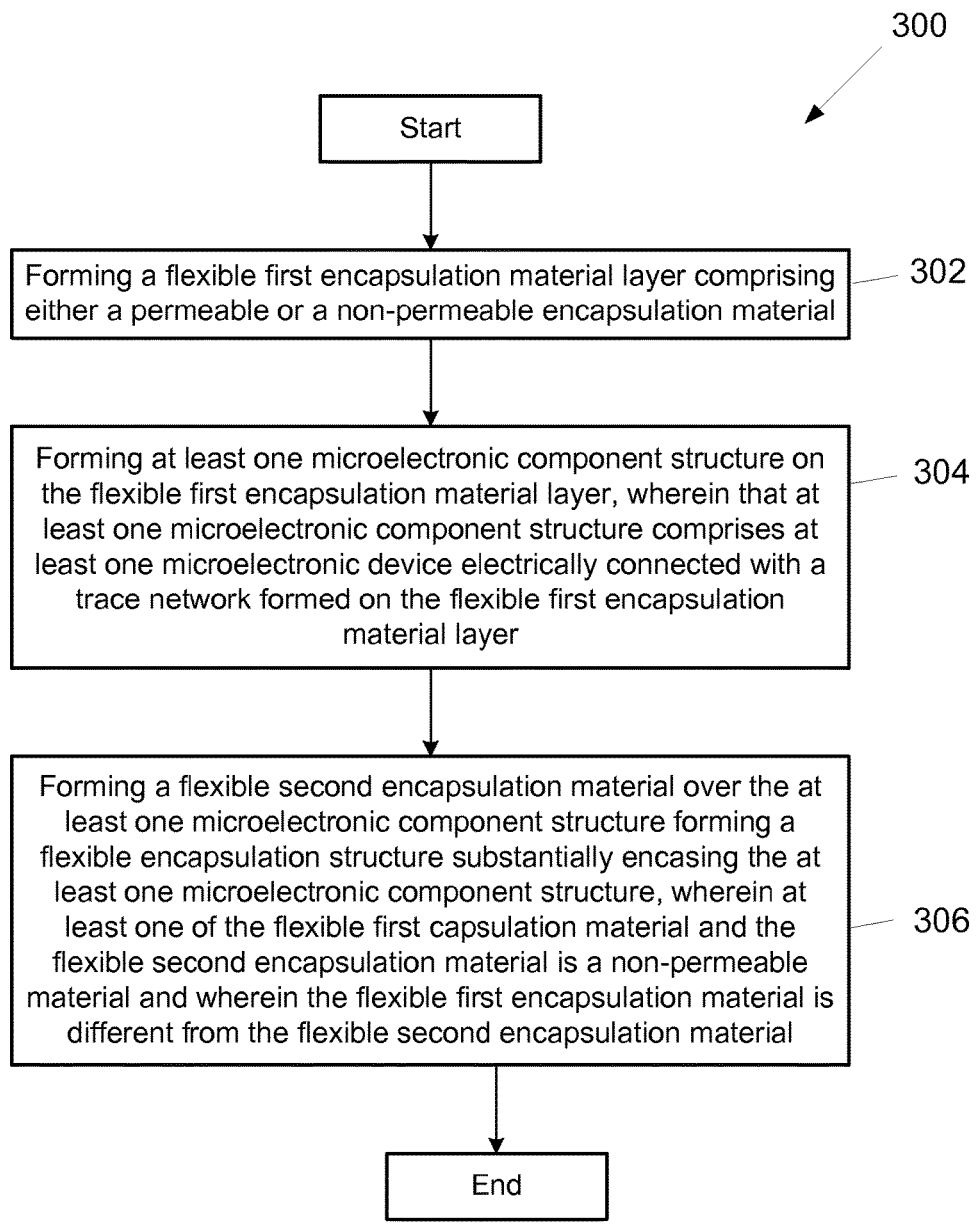
FIG. 10 is a flow diagram of a process of fabricating a microelectronic structure, according to another embodiment of the present description.

FIG. 10 is a flow chart of a process 300 of fabricating a flexible microelectronic system according to an embodiment of the present description. As set forth in block 302, a flexible first encapsulation material layer comprising either a permeable or a non-permeable encapsulation material may be formed. At least one microelectronic component structure may be formed on the flexible first encapsulation material layer, wherein the at least one microelectronic component structure comprises at least one microelectronic device electrically connected with a trace network formed on the flexible first encapsulation material layer, as set forth in block 304. As set forth in block 306, a flexible second encapsulation material may be formed over the at least one microelectronic component structure forming a flexible encapsulation structure substantially encasing the at least one microelectronic component structure, wherein at least one of the flexible first encapsulation material and the flexible second encapsulation material is a non-permeable material and wherein the flexible first encapsulation material is different from the flexible second encapsulation material.

Figure 11:
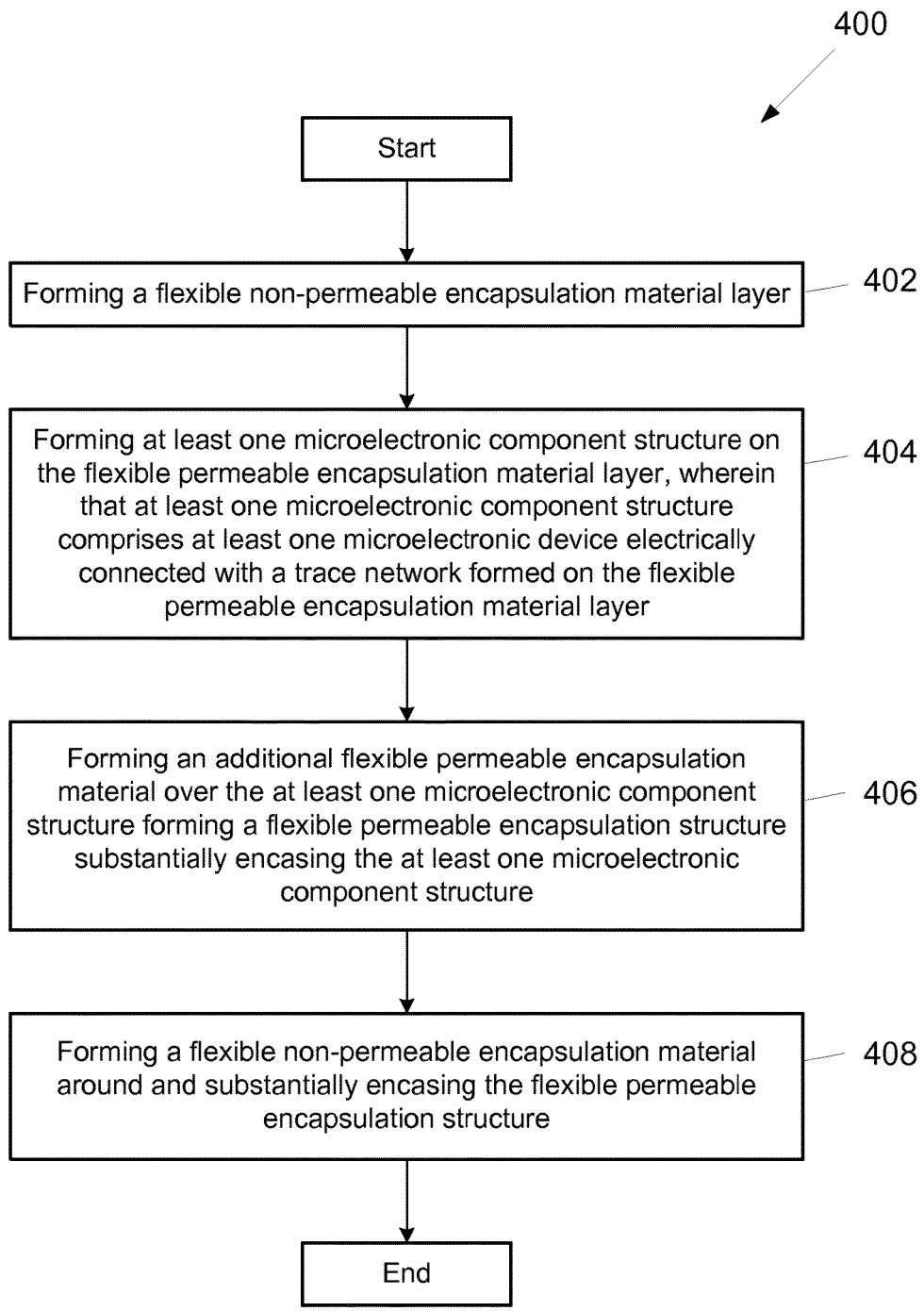
FIG. 11 is a flow diagram of a process of fabricating a microelectronic structure, according to still another embodiment of the present description.

FIG. 11 is a flow chart of a process 400 of fabricating a flexible microelectronic system according to an embodiment of the present description. As set forth in block 402, a flexible permeable encapsulation material layer may be formed. At least one microelectronic component structure may be formed on the flexible permeable encapsulation material layer, wherein the at least one microelectronic component structure comprises at least one microelectronic device electrically connected with a trace network formed on the flexible permeable encapsulation material layer, as set forth in block 404. As set forth in block 406, additional flexible permeable encapsulation material may be formed over the at least one microelectronic component structure forming a flexible permeable encapsulation structure substantially encasing the at least one microelectronic component structure. A flexible non-permeable encapsulation structure may be formed around and substantially encase the flexible permeable encapsulation structure, as set forth in block 408.

It is understood that the subject matter of the present description is not necessarily limited to specific applications illustrated in FIGS. 1-11. The subject matter may be applied to other microelectronic devices and assembly applications, as well as any appropriate electronic application, as will be understood to those skilled in the art.

The following examples pertain to further embodiments. Specifics in the examples may be used anywhere in one or more embodiments.

In Example 1, a microelectronic system may comprise a microelectronic component structure encapsulated in a flexible non-permeable encapsulation structure, wherein the microelectronic component structure comprises at least one microelectronic device electrically connected with a trace network.

In Example 2, the subject matter of Example 1 can optionally include the flexible non-permeable encapsulation structure comprising a flexible non-permeable encapsulation material selected from the group comprising butyl rubber, ethylene propylene rubber, fluoropolymer elastomer, and combinations thereof.

In Example 3, the subject matter of Example 1 or 2 can optionally include a flexible permeable encapsulation structure adjacent the microelectronic component structure and wherein the flexible non-permeable encapsulation structure substantially encases the flexible permeable encapsulation structure.

In Example 4, the subject matter of Example 3 can optionally include the flexible permeable encapsulation structure comprises polydimethylsiloxane.

In Example 5, the subject matter of any of Examples 1 to 4 can optionally include the microelectronic component structure comprising the at least one microelectronic device electrically connected to the trace network with at least one bond wire extending from an active surface of the microelectronic device to the trace network.

In Example 6, a microelectronic system may comprise a flexible first encapsulation material layer comprising either a permeable or a non-permeable encapsulation material, at least one microelectronic component structure on the flexible first encapsulation material layer, wherein the at least one microelectronic component structure comprises at least one microelectronic device electrically connected with a trace network formed on the flexible first encapsulation material layer, and a flexible second encapsulation material over the at least one microelectronic component structure forming a flexible encapsulation structure substantially encasing the at least one microelectronic component structure, wherein at least one of the flexible first encapsulation material and the flexible second encapsulation material is a non-permeable material and wherein the flexible first encapsulation material is different from the flexible second encapsulation material.

In Example 7, the subject matter of Example 6 can optionally include the flexible first encapsulation material and the flexible second encapsulation material are selected from the group comprising butyl rubber, ethylene propylene rubber, fluoropolymer elastomer, and polydimethylsiloxane.

In Example 8, the subject matter of Examples 6 or 7 can optionally include the microelectronic component structure comprising the at least one microelectronic device electrically connected to the trace network with at least one bond wire extending from an active surface of the microelectronic device to the trace network.

In Example 9, a method for fabricating a microelectronic system may comprise forming a flexible non-permeable encapsulation material layer, forming at least one microelectronic component structure on the flexible non-permeable encapsulation material layer, wherein the at least one microelectronic component structure comprises at least one microelectronic device electrically connected with a trace network formed on the flexible non-permeable encapsulation material layer, and forming an additional flexible non-permeable encapsulation material over the at least one microelectronic component structure forming a flexible non-permeable encapsulation structure substantially encasing the at least one microelectronic component structure.

In Example 10, the subject matter of Example 9 can optionally include forming the flexible non-permeable encapsulation structure from a material selected from the group comprising butyl rubber, ethylene propylene rubber, fluoropolymer elastomer, and combinations thereof.

In Example 11, the subject matter of Example 9 or 10 can optionally include providing a carrier and forming the flexible non-permeable encapsulation material layer on the carrier.

In Example 12, the subject matter of any of Examples 9 to 11 can optionally include forming a plurality of microelectronic component structures and further comprising singulating the microelectronic component structures from one another after forming the flexible non-permeable encapsulation structure.

In Example 13, the subject matter of any of Examples 9 to 12 can optionally include attaching a back surface of the microelectronic device to the flexible non-permeable encapsulation material layer and electrically connecting the microelectronic device to the trace network with at least one bond wire extending from an active surface of the microelectronic device to the trace network.

In Example 14, a method for fabricating a microelectronic system may comprise forming a flexible first encapsulation material layer comprising either a permeable or a non-permeable encapsulation material, forming at least one microelectronic component structure on the flexible first encapsulation material layer, wherein the at least one microelectronic component structure comprises at least one microelectronic device electrically connected with a trace network formed on the flexible first encapsulation material layer, and forming a flexible second encapsulation material over the at least one microelectronic component structure forming a flexible encapsulation structure substantially encasing the at least one microelectronic component structure, wherein at least one of the flexible first encapsulation material and the flexible second encapsulation material is a non-permeable material and wherein the flexible first encapsulation material is different from the flexible second encapsulation material.

In Example 15, the subject matter of Example 14 can optionally include forming the flexible first encapsulation material and forming the flexible second encapsulation material from materials selected from the group comprising butyl rubber, ethylene propylene rubber, fluoropolymer elastomer, and polydimethylsiloxane.

In Example 16, the subject matter of Example 14 or 15 can optionally include providing a carrier and forming the flexible first encapsulation material layer on the carrier.

In Example 17, the subject matter of any of Examples 14 to 16 can optionally include forming a plurality of microelectronic component structures and further comprising singulating the microelectronic component structures from one another after forming the flexible encapsulation structure.

In Example 18, the subject matter of any of Examples 14 to 17 can optionally include attaching a back surface of the microelectronic device to the flexible first encapsulation material layer and electrically connecting the microelectronic device to the trace network with at least one bond wire extending from an active surface of the microelectronic device to the trace network.

In Example 19, a method for fabricating a microelectronic system can comprise forming a flexible permeable encapsulation material layer, forming at least one microelectronic component structure on the flexible permeable encapsulation material layer, wherein the at least one microelectronic component structure comprises at least one microelectronic device electrically connected with a trace network formed on the flexible permeable encapsulation material layer, forming an additional flexible permeable encapsulation material over the at least one microelectronic component structure forming a flexible permeable encapsulation structure substantially encasing the at least one microelectronic component structure, and forming a flexible non-permeable encapsulation structure around and substantially encasing the flexible permeable encapsulation structure.

In Example 20, the subject matter of Example 19 can optionally include forming the flexible permeable encapsulation structure comprising forming a flexible polydimethylsiloxane encapsulation structure.

In Example 21, the subject matter of Example 19 or 20 can optionally include forming the flexible non-permeable encapsulation structure comprising forming the flexible non-permeable encapsulation structure selected from the group comprising butyl rubber, ethylene propylene rubber, fluoropolymer elastomer, and combinations thereof.

In Example 22, the subject matter of any of Examples 19 to 21 can optionally include providing a carrier and forming the flexible permeable encapsulation material layer on the carrier.

In Example 23, the subject matter of any of Examples 19 to 22 can optionally include forming a plurality of microelectronic component structures and further comprising singulating the microelectronic component structures from one another after forming the flexible permeable encapsulation structure.

In Example 24, the subject matter of any of Examples 19 to 23 can optionally include attaching a back surface of the microelectronic device to the flexible non-permeable encapsulation material layer and electrically connecting the microelectronic device to the trace network with at least one bond wire extending from an active surface of the microelectronic device to the trace network.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic system comprising:
a microelectronic component structure encapsulated in a flexible first encapsulation structure, wherein the microelectronic component structure comprises at least one microelectronic device electrically connected with a trace network, wherein the microelectronic device includes an active surface and an opposing back surface, wherein the microelectronic device active surface is electrically connected with the trace network, wherein the microelectronic component further comprises an adhesive material contacting the microelectronic device back surface, and wherein the flexible first encapsulation structure consists of a single material that completely surrounds and encases the microelectronic component structure, contacts the microelectronic device active surface, and contacts all surfaces of the adhesive material not in contact with the microelectronic device back surface, and wherein a portion of the flexible first encapsulation material extends through the trace network.

2. The microelectronic system of claim 1, wherein the flexible first encapsulation structure comprises a flexible non-permeable encapsulation material selected from the group comprising butyl rubber, ethylene propylene rubber, fluoropolymer elastomer, and combinations thereof.

3. The microelectronic system of claim 1, wherein the flexible first encapsulation structure comprises a flexible permeable encapsulation structure and further including a flexible second encapsulation structure, wherein the flexible second encapsulation structure comprises a flexible non-permeable encapsulation structure that completely surrounds and encases the flexible first encapsulation structure and the microelectronic component structure.

4. The microelectronic system of claim 3, wherein the flexible first encapsulation structure comprises polydimethylsiloxane.

5. The microelectronic system of claim 1, wherein the microelectronic component structure comprises the at least one microelectronic device electrically connected to the trace network with at least one bond wire extending from the active surface of the microelectronic device to the trace network.

6. A microelectronic system comprising:
a flexible first encapsulation material layer comprising either a permeable or a non-permeable encapsulation material;
at least one microelectronic component structure abutting the flexible first encapsulation material layer, wherein the at least one microelectronic component structure comprises at least one microelectronic device electrically connected with a trace network formed on and extending above the flexible first encapsulation material layer, wherein the microelectronic device includes an active surface and an opposing back surface, wherein the microelectronic device active surface is electrically connected with the trace network, wherein the microelectronic component further comprises an adhesive material contacting the microelectronic device back surface, and wherein the flexible first encapsulation material contacts the adhesive material; and
a flexible second encapsulation material over the at least one microelectronic component structure and abutting the flexible first encapsulation material layer, wherein the flexible first encapsulation material layer and the flexible second encapsulation material form a flexible encapsulation structure completely surrounding and encasing the at least one microelectronic component structure, wherein at least one of the flexible first encapsulation material layer and the flexible second encapsulation material is a non-permeable material and wherein the flexible first encapsulation material is different from the flexible second encapsulation material, wherein the flexible second encapsulation contacts the microelectronic device active surface and contacts the adhesive material, and wherein a portion of the flexible second encapsulation material extends through the trace network.

7. The microelectronic system of claim 6, wherein the flexible first encapsulation material layer and the flexible second encapsulation material are selected from the group comprising butyl rubber, ethylene propylene rubber, fluoropolymer elastomer, and polydimethylsiloxane.

8. The microelectronic system of claim 6, wherein the microelectronic component structure comprises the at least one microelectronic device electrically connected to the trace network with at least one bond wire extending from the active surface of the microelectronic device to the trace network.

9. The microelectronic system of claim 1, wherein the microelectronic component structure further comprises at least one secondary microelectronic device attached to the trace network.

10. The microelectronic system of claim 1, wherein the trace network comprises a metal selected from the group consisting of copper, aluminum, gold, titanium, nickel, tungsten, silver, zirconium, cobalt, and alloys thereof.

11. The microelectronic system of claim 5, wherein the flexible first encapsulation structure surrounds the at least one bond wire.

12. The microelectronic system of claim 5, wherein the at least one bond wire is a metal selected from the group consisting of copper, aluminum, nickel, silver, gold, and alloys thereof.

13. The microelectronic system of claim 6, wherein the microelectronic component structure further comprises at least one secondary microelectronic device attached to the trace network.

14. The microelectronic system of claim 6, wherein the trace network comprises a metal selected from the group consisting of copper, aluminum, gold, titanium, nickel, tungsten, silver, zirconium, cobalt, and alloys thereof.

15. The microelectronic system of claim 8, wherein the flexible second encapsulation material surrounds the at least one bond wire.

16. The microelectronic system of claim 8, wherein the at least one bond wire is a metal selected from the group consisting of copper, aluminum, nickel, silver, gold, and alloys thereof.

* * * * *